United States Patent
Li et al.

(10) Patent No.: US 7,432,583 B2
(45) Date of Patent: *Oct. 7, 2008

(54) LEADLESS LEADFRAME PACKAGE SUBSTITUTE AND STACK PACKAGE

(75) Inventors: Felix C. Li, San Jose, CA (US); Jaime A. Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 10/888,827

(22) Filed: Jul. 8, 2004

(65) Prior Publication Data

US 2005/0001294 A1  Jan. 6, 2005

Related U.S. Application Data

(62) Division of application No. 10/349,695, filed on Jan. 22, 2003, now Pat. No. 6,781,243.

(51) Int. Cl.
*H01L 29/40* (2006.01)

(52) U.S. Cl. ................. 257/666; 257/777
(58) Field of Classification Search .......... 257/777, 257/690, 778, 666
See application file for complete search history.

(56) References Cited

U.S. PATENT DOCUMENTS

| | | | |
|---|---|---|---|
| 5,239,198 A | 8/1993 | Lin et al. | |
| 5,241,456 A | 8/1993 | Marcinkiewicz et al. | |
| 5,376,825 A | 12/1994 | Tukamoto et al. | |
| 5,798,564 A | 8/1998 | Eng et al. | |
| 6,020,629 A | 2/2000 | Farnworth et al. | |
| 6,130,473 A | 10/2000 | Mostafazadeh et al. | |
| 6,153,928 A | 11/2000 | Cho | |
| 6,326,544 B1 | 12/2001 | Lake | |
| 6,339,255 B1 | 1/2002 | Shin | |
| 6,372,539 B1 | 4/2002 | Bayan et al. | |
| 6,381,141 B2 | 4/2002 | Corisis et al. | |
| 6,399,415 B1 | 6/2002 | Bayan et al. | |
| 6,400,004 B1 | 6/2002 | Fan et al. | |
| 6,452,255 B1 | 9/2002 | Bayan et al. | |
| 6,524,886 B2 | 2/2003 | Lee | |
| 6,534,855 B1 | 3/2003 | Ahn et al. | |
| 6,605,866 B1 | 8/2003 | Crowley et al. | |
| 6,610,924 B1 | 8/2003 | Lee et al. | |
| 6,710,246 B1 | 3/2004 | Mostafazadeh et al. | |
| 6,723,585 B1 | 4/2004 | Tu et al. | |
| 6,781,243 B1 * | 8/2004 | Li et al. ................. 257/777 |

(Continued)

FOREIGN PATENT DOCUMENTS

JP  2002-93982  3/2002

OTHER PUBLICATIONS

U.S. Appl. No. 09/658,166, filed Sep. 8, 2000.

*Primary Examiner*—Roy K Potter
(74) *Attorney, Agent, or Firm*—Beyer Law Group LLP

(57) ABSTRACT

A semiconductor package is provided with an internal package formed in the cavity of the external leadless leadframe package (LLP). The internal package is a leadless leadframe package and provides a substrate for mounting one or more die and passive devices to form the external LLP. By arranging the die and passive components on the internal package, higher chip density and a smaller form factor may be achieved.

12 Claims, 9 Drawing Sheets

U.S. PATENT DOCUMENTS

| | | |
|---|---|---|
| 2002/0177256 A1 | 11/2002 | Lee |
| 2003/0071333 A1 | 4/2003 | Matsuzawa |
| 2003/0071344 A1 | 4/2003 | Matsuzawa et al. |
| 2003/0082854 A1 | 5/2003 | Kasahara et al. |
| 2003/0164535 A1 | 9/2003 | Inatsugu |

* cited by examiner

LEADLESS LEADFRAME PACKAGE SUBSTITUTE AND STACK PACKAGE

CROSS REFERENCE TO RELATED APPLICATIONS

This application is a Divisional of U.S. patent application Ser. No. 10/349,695 filed on Jan. 22, 2003 now U.S. Pat. No. 6,781,243 which is incorporated herein by reference.

This application is related to commonly assigned U.S. Pat. Nos. 6,372,539, 6,452,255, 6,710,246, 6,723,585 and U.S. patent application Ser. No. 09/658,166, filed Sep. 8, 2000 each of which are incorporated herein by reference.

BACKGROUND OF THE INVENTION

1. Field of the Invention

The present invention relates generally to the packaging of integrated circuits. More particularly, the present invention relates to a method and apparatus for providing high density chips on a printed circuit board or other substrate using leadless leadframe packages.

2. Description of the Related Art

A leadless lead frame package (LLP) is an integrated circuit package design that contemplates the use of a lead frame in the formation of a chip scale package (CSP). The resulting packages are sometimes referred to as quad flat packs—no lead (QFN) packages. As illustrated in FIG. 1, in typical leadless lead frame packages, a copper lead frame strip or panel 101 is patterned (typically by stamping or etching) to define a plurality of arrays 103 of chip substrate features 105. Each chip substrate feature 105 includes a die attach pad 107 and a plurality of contacts 109 disposed about their associated die attach pad 107. Very fine tie bars 111 are often used to support the die attach pads 107 and contacts 109.

During assembly, dice are attached to the respective die attach pads and conventional wire bonding is used to electrically couple bond pads on each die to their associated contacts 109 on the lead frame strip 101. After the wire bonding, a plastic cap is molded over the top surface of the each array 103 of wire bonded dice. The dice are then singulated and tested using conventional sawing and testing techniques.

FIG. 2 illustrates a typical resulting leadless lead frame package. The die attach pad 107 supports a die 120 which is electrically connected to its associated contacts 109 by bonding wires 122. A plastic casing 125 encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip can then be surface mounted on a printed circuit board or other substrate using conventional techniques.

Since leadless lead frame packaging have proven to be a cost effective packaging arrangement, there are continuing efforts to provide further improvements to the package structure and/or processing to permit the package style to be used in additional applications and/or to improve specific characteristics of the resultant devices.

SUMMARY OF THE INVENTION

To achieve the foregoing and other objects and according to the purpose of the present invention, a variety of improved packaging arrangements are disclosed. A semiconductor package is provided with an internal package formed in the cavity of the external leadless leadframe package (LLP). The internal package is a leadless leadframe package and provides a substrate for mounting one or more die and passive devices to form the external LLP. By arranging the die and passive components on the internal package, higher chip density and a smaller form factor may be achieved. Moreover, better electrical performance results from the shorter trace lengths.

In one embodiment, a semiconductor package includes an internal package having a first plurality of contacts. The first plurality of contacts is exposed on a first surface of the internal package. The internal package further includes a first die electrically connected to at least some of the first plurality of contacts. The internal package further includes a first molding material that encapsulates the first die. The semiconductor package further includes a leadframe having a second plurality of contacts. A second die is mounted on the internal package and electrically connected to the second plurality of contacts. A second molding material is provided and encapsulates the second die and a portion of the internal package.

In another embodiment, multiple dies are arranged on the internal package and connected by wire bonds to contacts at the periphery of the external semiconductor package.

These and other features and advantages of the present invention are described below with reference to the drawings.

DETAILED DESCRIPTION OF PREFERRED EMBODIMENTS

Reference will now be made in detail to preferred embodiments of the invention. A number of improvements to leadless package designs are described below. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 3:
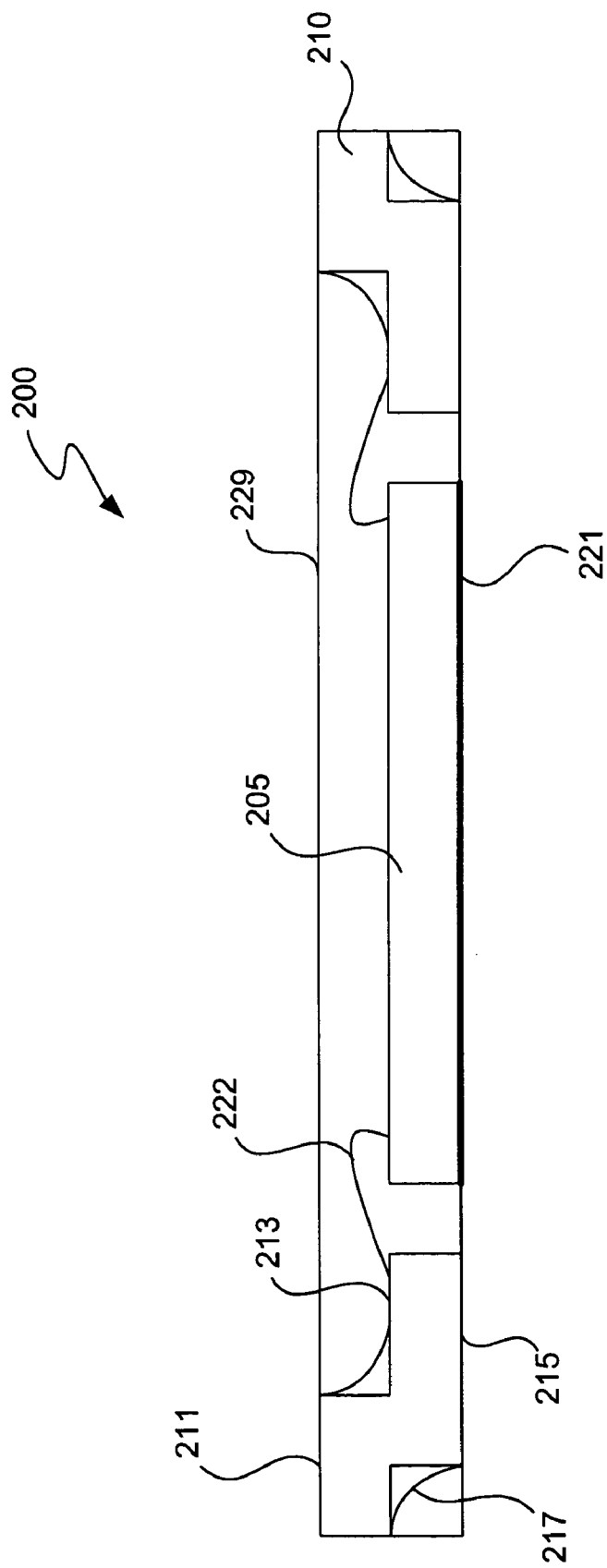
FIG. 3 is a diagrammatic cross sectional side view of a leadless package design in accordance with one embodiment of the present invention.

Referring initially to FIG. 3, a preferred embodiment of a thin LLP used in a semiconductor package embodiment of the present invention will be described. As shown therein, the package 200 includes a die 205 and a plurality of contacts 210 that are generally positioned at appropriate locations around the die. The contacts 210 are stepped such that they include a top surface 211, a shelf 213 and a bottom surface 215. Additionally, recesses or under-steps 217 may be formed in the bottom sides of some or all of the contacts 210. The die 205 has a plurality of bond pads that are electrically connected to the shelf portions 213 of associated contacts. In the embodiment shown, bonding wires are used, although it should be appreciated that any suitable technique can be used to electrically couple the die to the contacts 210.

Figure 1A:
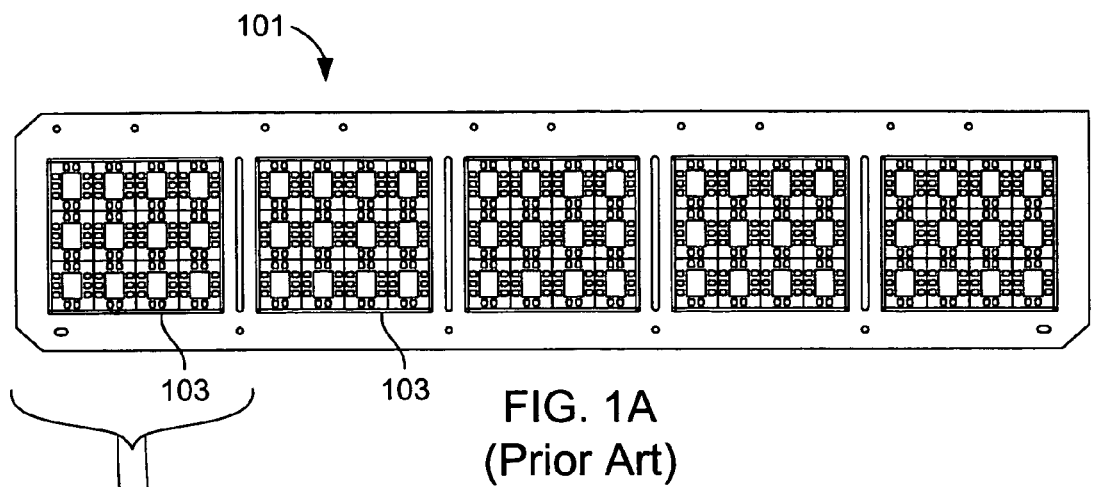
FIGS. 1(a)-1(c) illustrates a lead frame strip of the type that has previously been used to form leadless lead frame packages.
Figure 1B:
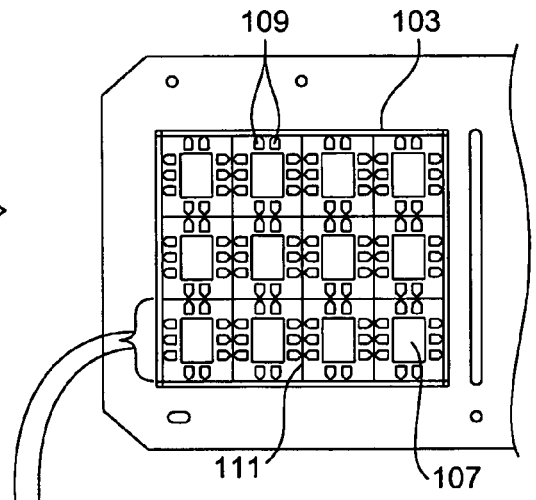
Figure 1C:
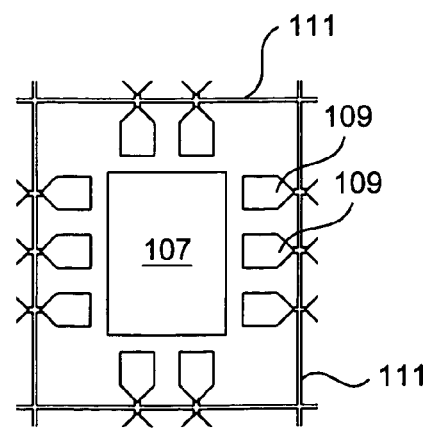
Figure 2:
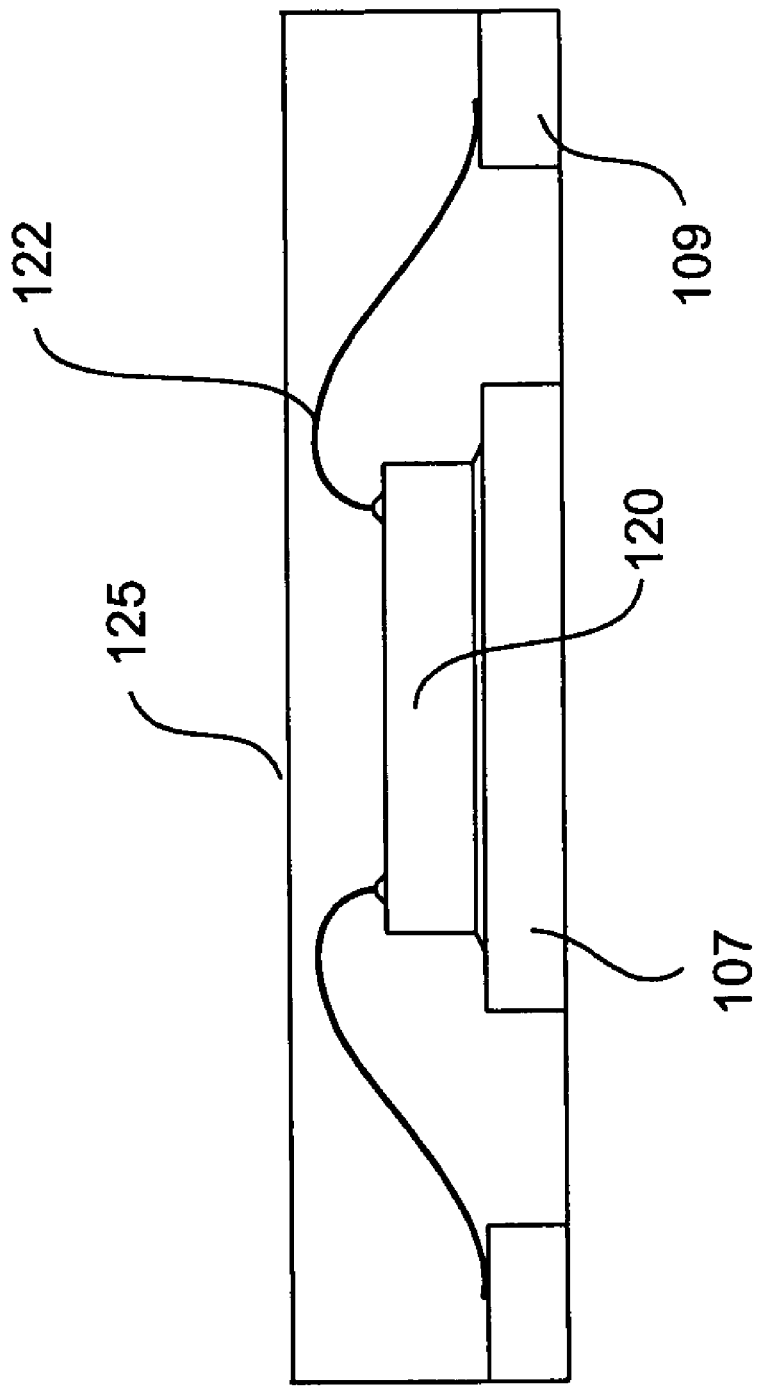
FIG. 2 is a diagrammatic cross sectional side view of a conventional leadless lead frame package.

The top surface of the die 205, the bonding wires 222 and the contact shelves 213 are encapsulated by a casing 229. The casing 229 may be formed in any appropriate manner. The packages are generally formed in panel form on a lead frame panel and the casing 229 may be formed by either individually molding the packages, glop topping or stencil printing type processes or molding a plastic cap over the top surface of an array of wire bonded dice as described above and below. Thus, the leadless package may (but need not) be produced quite similarly to the conventional leadless package illustrated in FIG. 2. However, the die attach pad is eliminated. With this arrangement, the die sits lower in the package and both the overall height of the package and the bonding wires 222 can be shortened accordingly. It should be appreciated that the elimination of the die attach pad allows the die to sit lower in the package, which will tend to reduce the required length of the bonding wire 222. Shortening the bonding wires can provide the added benefit of reducing inductance.

As will be appreciated by those familiar with wire bonding generally, a first end of the bonding wire is typically "ball" bonded to its associated surface (e.g., a bond pad on die 205 in FIG. 3), which forms a ball bond. The second end of the bonding wire is typically attached to a second surface (e.g., the shelf 213 of contact 210 in FIG. 3), using a bond commonly referred to as a "stitch" or "wedge" bond. The bonding wire leaving ball bond tends to rise substantially perpendicularly away from the surface of the die 205, while the bonding wire tends to approach the stitch bond in a manner that is closer to parallel with the surface of contact 210. Thus a "loop" is formed by the bonding wire. As is well known to those skilled in the art, state of the art wire bonding machines permit a great deal of control over the height of the loop. However, the loop generally cannot be eliminated and in small devices, the loop height generally has a significant effect on the overall length of the bonding wires used. Therefore, eliminating the die attach pad has the effect of lowering the bonding wires which permits the reduction of the overall package thickness. With a reduced overall package height, the formed package is suitable for vertically stacking a second die over a first internal package and providing higher density circuitry.

The elimination of the die attach pad has another side benefit of eliminating the risk of delamination of the die from the die attach pad. However, trying to directly attach a die to a printed circuit board or other substrate or even to a heat sink can lead to different delamination issues. In many applications, the delamination risks can be reduced significantly by plating the back surface of the die 205 with a thin metal layer 221 as illustrated in FIG. 3. The metal layer 221 may be formed using any suitable technique. One particularly efficient metal layer formation technique is to deposit the metal layer on the backside of the wafer used to create the dice before singulation (and after any desired backside grinding). By way of example, conventional vapor deposition works well. The metal layer 221 can be formed from any suitable metal. Generally, it is desirable that the metal layer 221 have good soldering characteristics and be compatible with the die. When desired, a multi-layered metal stack may be used. By way of example, multilayered stacks such as Chrome/Silver/Tin (Chrome/Ag/Sn), Titanium/Nickel/Silver (Ti/Ni/Ag) and Nickel/Gold (Ni/Au) stacks work well as the metal layer 221.

It should be apparent that the described package structure is quite versatile. Although the package can be surface mounted on a printed circuit board in a die up or die down configuration, the configuration of the package and the low profile makes the package suitable for attaching to a second leadless leadframe package (LLP) by inserting the "thin" LLP so formed in a cavity formed in a second LLP. Some of the advantages of the LLP formed without the die pad and attached to a printed circuit board are also applicable to its use in a stacked LLP arrangement. For example, in a conventional manner of attaching to a PCB with the die facing up (die up) configuration (i.e., in the orientation shown in FIG. 3), with the metal layer 221 and the bottom surfaces 215 of the contacts 210 being soldered to a printed circuit board or other substrate, the metal layer provides a good thermally conductive pathway from the die to the substrate. In a stacked die arrangement as described in embodiments of the present invention, this thermally conductive pathway may be used to transfer heat to a die attach pad positioned under a second die mounted on the die of the internal (i.e., first) LLP.

Figure 4:
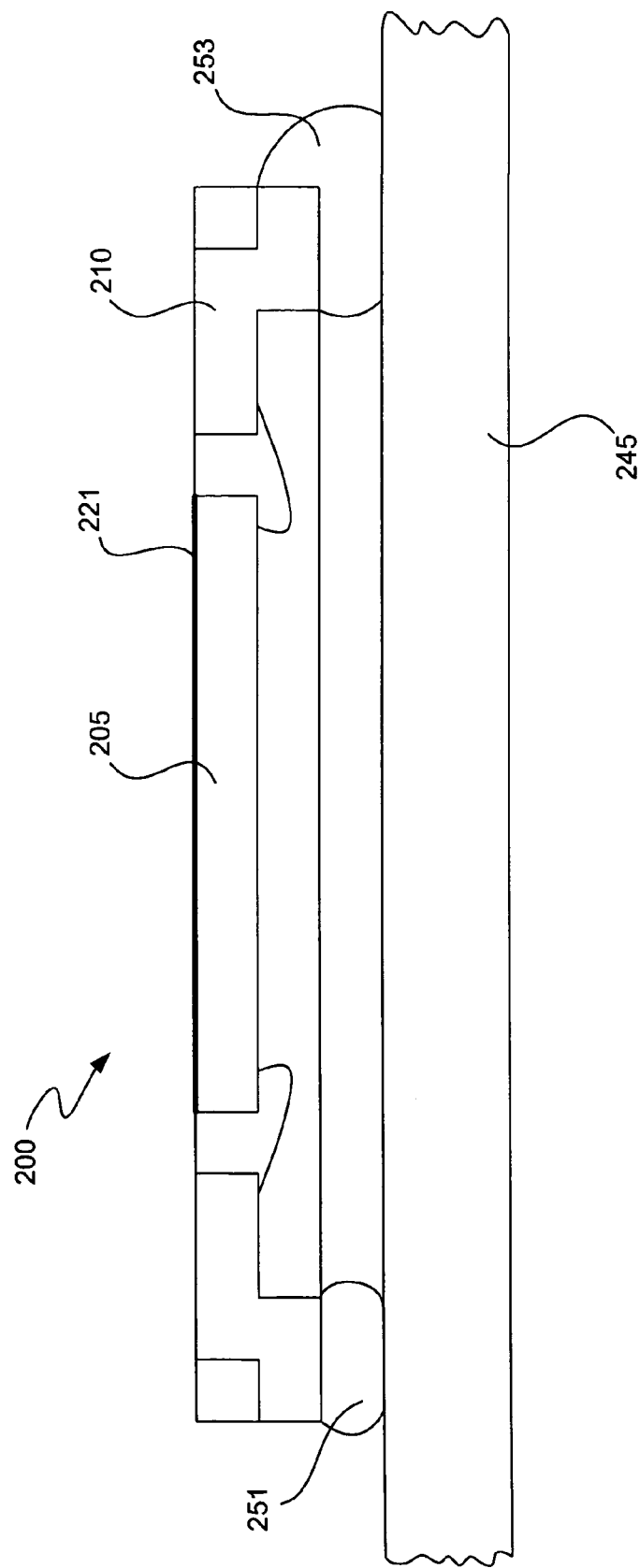
FIG. 4 is cross sectional side view of the leadless package design of FIG. 3 mounted to a printed circuit board in a cavity down configuration.

Alternatively, as illustrated in FIG. 4, the package may be attached by surface mounting in a die facing down (die down) configuration by soldering the top surfaces 211 of the contacts 210 to a substrate (e.g., printed circuit board 245). It is noted that since the upper portion of the contact 210 extends to the edge of the package 200, the attachment of the contacts may be done using either normal sized solder joints 251 as diagrammatically illustrated on the left side of FIG. 4, or extra large solder joints 253 as illustrated on the right side of FIG. 4. Of course, an underfill material (not shown) may optionally be used to fill the gap between the package 200 and the printed circuit board 245. This alternative surface mounting technique is applicable in one embodiment of the present invention to providing additional I/O pads for electrically connecting two stacked LLP's.

In the preceding (and following) discussions we have sometimes used the terms "top" and "bottom" to refer to one of the surfaces or sides of the die, the package, the contacts or some other component. It should be apparent that these terms are used only in an effort to simplify the explanations and are not necessarily related to physical up or down since the package can be mounted in any orientation. In most instances, the top surface of a die will be a side having bond pads thereon.

Figure 5:
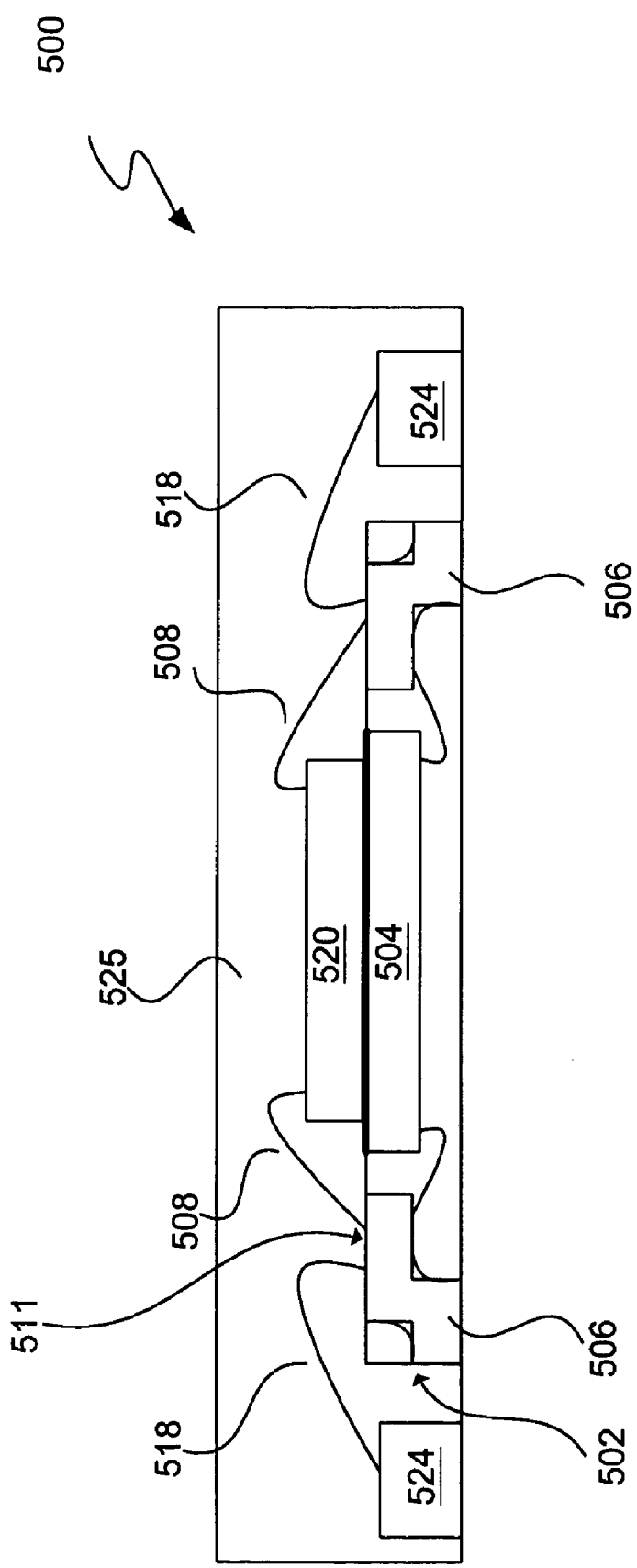
FIG. 5 is a diagrammatic cross sectional side view of a leadless semiconductor package design in accordance with one embodiment of the present invention.

FIG. 5 is a diagram illustrating a semiconductor package in accordance with one embodiment of the present invention. In accordance with this embodiment, an internal package such as the package described with reference to FIG. 3 forms a substrate for mounting one or more dies. The semiconductor package 500 thus includes an internal leadless package 502 in accordance with the design illustrated in FIG. 3. The internal package 502 preferably is formed without a die attach pad. Although in other embodiments the die 504 may be attached to a die attach pad, eliminating the die attach pad allows for a lower profile internal leadless package and thus a lower profile for the stacked LLP package. As noted above, the bonding pads (not shown) on die 504 are attached to a plurality of contacts 506 formed around the periphery of the die 504. Preferably, the top surface of the contacts 506 (i.e., the surface of the contacts substantially coplanar with the backside of the die 504) are exposed and form a mounting plane for the mounting of active and passive components, the contacts also being suitable for wire bonding to a one or more dies or soldering to passive components, as further illustrated in FIGS. 6-8. The contacts 506 are shown as also exposed on a bottom surface of the semiconductor package and thus enable in one embodiment direct electrical connection by surface mounting techniques to a PCB or other substrate. Although the contacts are shown as being exposed on two surfaces, the invention is not so limited. That is, in alternative embodiments, the contacts may be exposed on only one surface, more preferably the surface facing the second die (520) to enable their use as a substrate for the second die(s) and other components such as passive resistors or capacitors.

Preferably, the internal package 502 has a thin profile for mounting the internal package within the "cavity" of a second leadless package. In order to form such a suitable ultra thin internal package, the die 504 is preferably a thin die, for example, 0.1 mm or less in thickness. In order to encapsulate the die 504 in the internal package, bonding wires 508, and contacts 506, liquid encapsulation or a molding process may be used.

The semiconductor package 500 further preferably includes at least one die 520 (i.e., the second die) mounted on the substrate mounting plane provided by the plurality of contacts 506 exposed on the top surface of the internal package 502. Preferably, the back surface of the die 520 is attached to the internal package 502 using techniques for attaching die known to those of skill in the relevant art. For example, the die 520 may be attached using a conductive epoxy. That is, conductive epoxy may be dispensed on the top surface of the internal package 502. As discussed above, the internal package's die 504 may be metallized to provide improved heat transfer from the die directly to the surface attached to the die. Thus, in one embodiment, the back surface of the die 504 is silver plated and a conductive epoxy is dispensed to directly attach the backside of the second die 520 to the silver plated region of the die 504. Alternatively, a die attach pad for a second leadframe may be positioned between the first die (504) back surface and the second die 520 back surface, with conductive epoxy providing the adhesion with both sides of the die attach pad. That is, since silver epoxy will adhere very well to either the die attach pad or the die back, the semiconductor package may involve attachment to the bare Si die back in one embodiment while in alternative embodiments a die attach pad is included.

A wide variety of die shapes, sizes, and numbers may be mounted on the substrate provided by the internal package without departing from the spirit and scope of the present invention. For example, a preferable range for the second die thickness is 0.10 to 0.15 mm, to enable wire bonds to be placed and to still provide a low profile package. Moreover, a die thickness in this range facilitates assembly. Preferably, the wire bond will incorporate a low loop. As illustrated, bond pads located on the top surface of the second die 520 are connected to a plurality of contacts 524 located on the periphery of the semiconductor package 500. The contacts 524 form a leadframe package surrounding the internal package 502 and may take any configuration commonly used or known for leadless leadframes. Alternatively, the contacts 524 are formed from a conventional leadframe such as used, for example, in dual-in-line (DIP) and quad flat pack (QFP) packages.

The semiconductor package 500 is shown with the contacts 524 recessed below the top surface of the package 500. That is, a casing 525 may be formed using conventional techniques to encapsulate the semiconductor package 500 without making provisions for exposing the contacts 524 at the top surface of the package. Electrical connection is made between the bonding pads on the top surface of the second die 522 and the contacts 506 of the internal package 502 by any suitable means for providing electrical connection as known to those of skill in the art. For example, the bonding pads of the second die 522 may be connected by wire bonding methods. That is, a ball bond may be formed using gold or other suitable wires and a stitch bond formed using the other end of the gold wires in contact with contacts 506. In turn, a ball bond may be formed on selected ones of the first plurality of contacts 506 to electrically connect the contacts with contacts 524, such as shown using wire bonds 518. Thus, with this arrangement, the internal package 502 acts as a substrate for disposing and making electrical connection with active components, including preferably one or more dies. By forming a semiconductor package in this manner, the electrical performance of the circuit is improved due to the shorter trace lengths and shorter electrical paths required to send signals between the first and second dies.

The process for forming the semiconductor package may commence with the mounting of the internal package (i.e., the thin LLP) on suitable tape with the contacts 506 exposed at least on the surface designated for attachment to the second die. That is, the internal package is mounted on the tape so that the internal package contacts are face up. Suitable tapes for this purpose are available commercially from a number of manufacturers including Nitto tape available from Nitto Denko America of Fremont, Calif., USA and Hitachi tape manufactured by Hitachi Chemical Co., Ltd. of Ibaraki, Japan.

Next, conductive epoxy is dispensed on the internal package, at the location of the internal package's die for providing an adhesive connection and thermal conduction from the internal package. Next, the active and passive devices are selected and placed on the internal package surface. That is, the die(s) are positioned to adhere to the conductive epoxy and the passive components such as the capacitors and resistors are placed in position for electrical connection to the exposed contacts 506 of the internal package 502. The passive components may be electrically connected to the selected contacts by methods known to those of skill in the art, such as, for example, by soldering techniques.

Preferably, the overall thickness of the internal package 502 is 0.3 mm or less. By using such a "thin" internal package, the overall height of the semiconductor package 500 may be preferably limited to about 0.6 mm, although the invention is not limited to these dimensions. That is, the internal LLP package may be a conventional "thicker" LLP using a conventional die attach pad or may be formed without the use of the die attach pad. Likewise, the second die may be mounted on a die attach pad as part of a conventional leadframe or alternatively as part of an LLP, again without departing from the spirit or scope of the present invention.

In order to facilitate attachment of bonding wires and passive components, the contacts 506 are plated with a suitable bonding metal, for example Pd/Ni. The contacts 524 are also preferably plated, such as by using PdNi, to allow both wire bonding and soldering techniques to form satisfactory electrical and mechanical bonds with connecting wires. Preferably, contacts 524 are formed from a leadframe which is preplated with PdNi. The contacts 524 are preferably exposed in one embodiment at a bottom surface of the package 500 to permit surface mounting of the semiconductor package 500 to a PCB or other substrate. Of course, in alternative embodiments, the leadframe forming the contacts 524 may be a conventional leadframe resulting in external I/O connections made in the various ways applicable to conventional leadframes, including contacts extending from the sides of the semiconductor package. External I/O connection may also be effectuated through contacts 506 exposed at the bottom surface of the semiconductor package 500. That is, the configuration of the contacts 506 as illustrated in FIG. 5 permit bonding of the bonding wires of the internal leadframe 502 on a shelf of the contact 506, and an exposed surface for external I/O on the bottom surface of the package 500, and an exposed mounting surface 511 for mounting of electrical components, such as integrated circuit active devices and passive components (e.g., capacitors and resistors).

Figure 6:
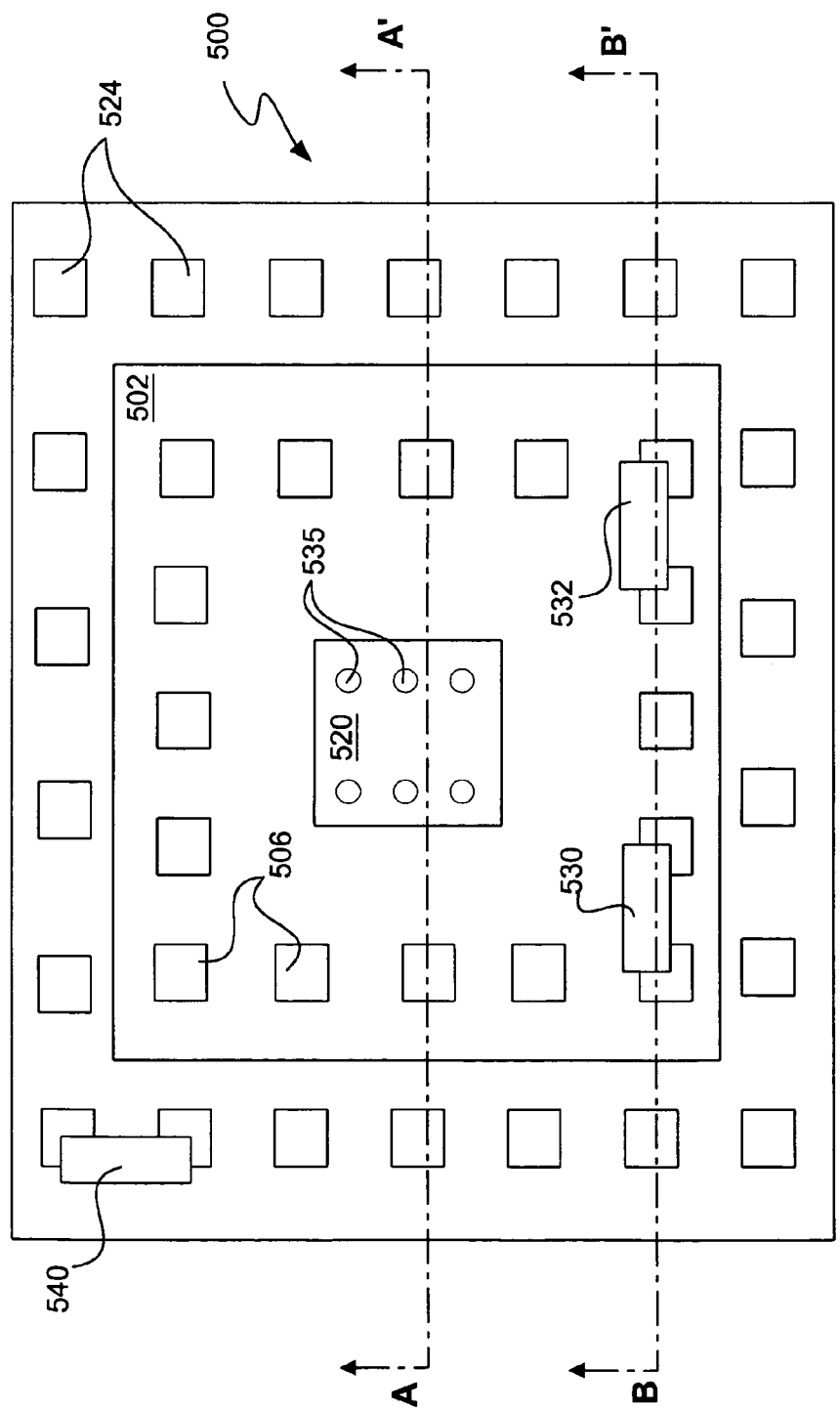
FIG. 6 is a diagram illustrating a top view of a leadless semiconductor package design illustrated in FIG. 5 in accordance with one embodiment of the present invention.

FIG. 6 is a diagram illustrating a top view of the leadless semiconductor package design 500 illustrated in FIG. 5 in accordance with one embodiment of the present invention. The cross sectional side view illustrated in FIG. 5 is representative of a cross section such as sectioned along sectional line A-A'. This view illustrates the semiconductor package 500 with the molding and bonding wires removed for clarity purposes. Further illustrated in FIG. 6 are passive components connecting selected ones of the plurality of contacts of the internal package 502. Chip capacitor 530 and chip resistor 532 are shown electrically connected to contacts 506 of the internal package 502. The top plane for contacts 506 form a mounting plane for mounting of active or passive components, such as including chip capacitor 530 and resistor 532. Small packaged integrated circuits may also be mounted on this mounting plane, for example small outline transistor (SOT) packages. It is to be appreciated that the second die's bonding pads 535 are also preferably connected to selected ones of the internal package's contacts 506. For clarity of illustration, the bonding wires connecting for example the first plurality of contacts 506 to the bonding pads 535 of the second die 520 or to the second plurality of contacts 524 are not shown. It is to be appreciated that conductive wires may be used to connect the second die 520 to any of the first or second pluralities of contacts without departing from the scope of the present invention. In an alternative embodiment, active or passive components may be mounted on and electrically connected to selected ones of the contacts 524 of the leadframe. For example, passive device 540 is shown connecting 2 of the contacts 524. It is to be further appreciated that the leadless leadframe packages forming the internal package or the external package may have the exposed contacts formed alternatively in 2 or more rows.

Figure 7:
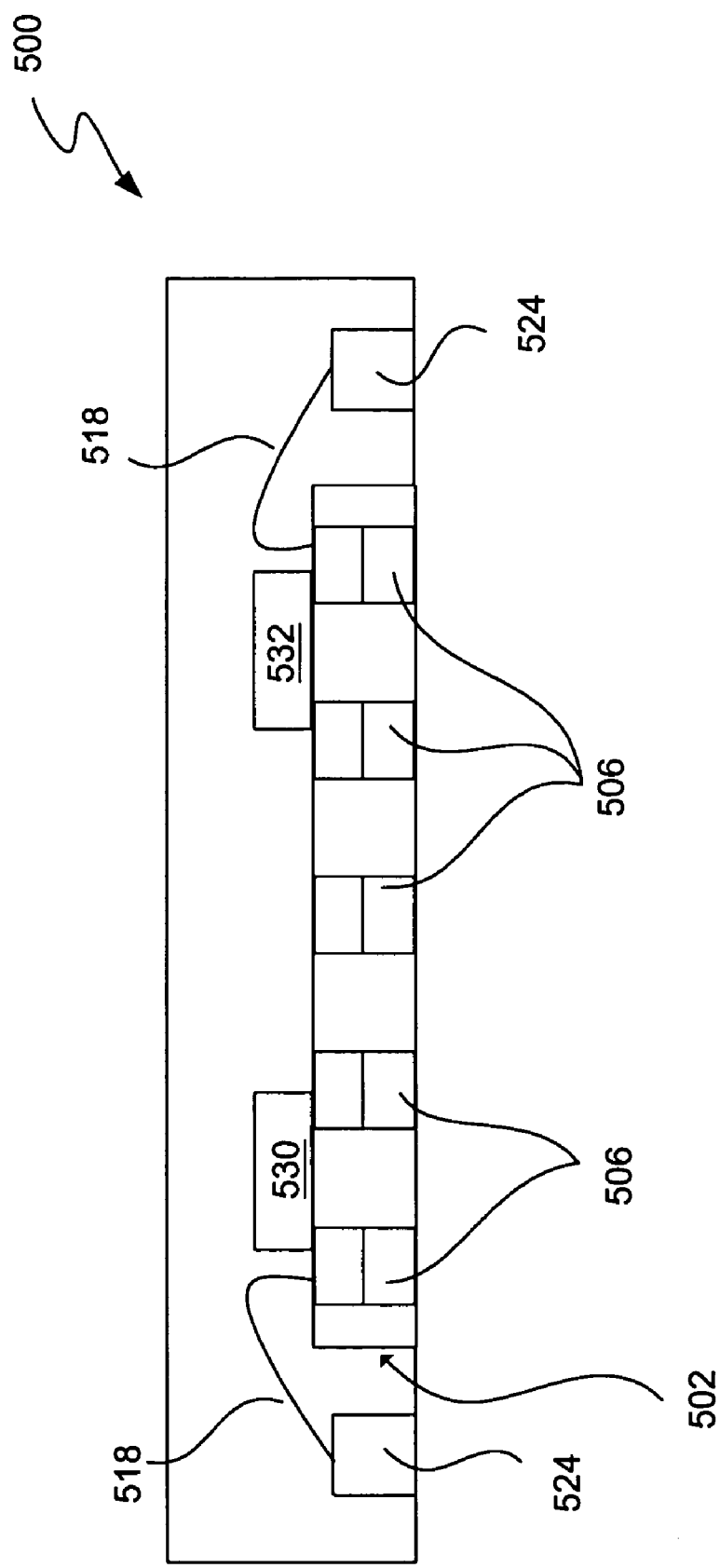
FIG. 7 is a diagrammatic cross sectional side view of a leadless semiconductor package design in accordance with one embodiment of the present invention.

FIG. 7 is a diagrammatic cross sectional side view of a leadless semiconductor package design 500 in accordance with one embodiment of the present invention. The diagrammatic cross sectional view illustrated corresponds to the sectional line B-B' as illustrated in FIG. 6. For clarity of illustration, the second die 520 is not shown in this view. As shown, chip capacitor 530 and chip resistor 532 are electrically connected to selected ones of the contacts 506 located in the leadless leadframe package 502 comprising the internal package. It will be appreciated that in one embodiment bonding wires 518 form an electrical connection between selected ones of the contacts 506 of the inner leadframe package and the contacts 524 located at the perimeter of the exterior leadless leadframe package forming the semiconductor package 500.

Figure 8:
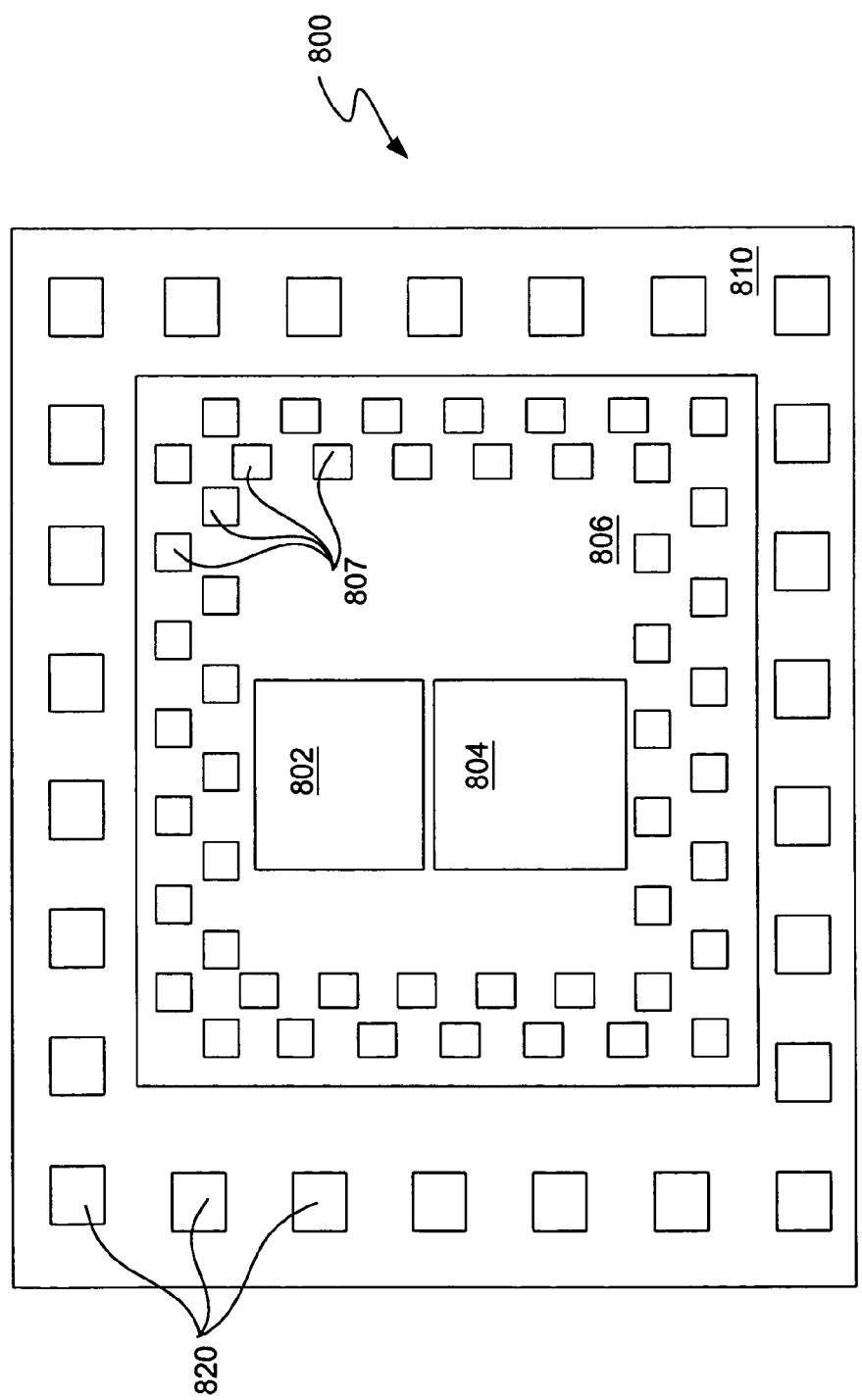
FIG. 8 is a diagram illustrating a top view of a leadless semiconductor package design having multiple dies mounted on the internal package in accordance with one embodiment of the present invention.

FIG. 8 is a diagram illustrating a top view of a leadless semiconductor package design 800 having multiple dies mounted on the internal package in accordance with an alternative embodiment of the present invention. As illustrated, dies 802 and 804 are mounted on the internal package, i.e., leadless leadframe package 806. Thus, flexibility can be achieved in using the leadless leadframe package 806 as a substrate for active devices such as dies 802 and 804 as well as passive devices, such as the chip capacitors and resistors shown in FIGS. 6 and 7. Although 2 dies are shown, the invention is not so limited. More die may be mounted and electrically connected as limited only be the available mounting space and electrical connections required. Also illustrated is the interior LLP 806 having 2 staggered rows of contacts 807 provided. These additional contacts provided by multiple rows (2 or 3 or more) provide greater capabilities for mounting and electrical connection with active and passive components. In alternative embodiments, similar staggered rows of contacts (e.g. 2 or 3 or more) may be formed on the external LLP 810 to increase the external I/O capabilities and also increase the mounting capabilities. Moreover, the multiple rows of contacts may be formed on both the internal LLP 806 and the exterior LLP 810.

Figure 9:
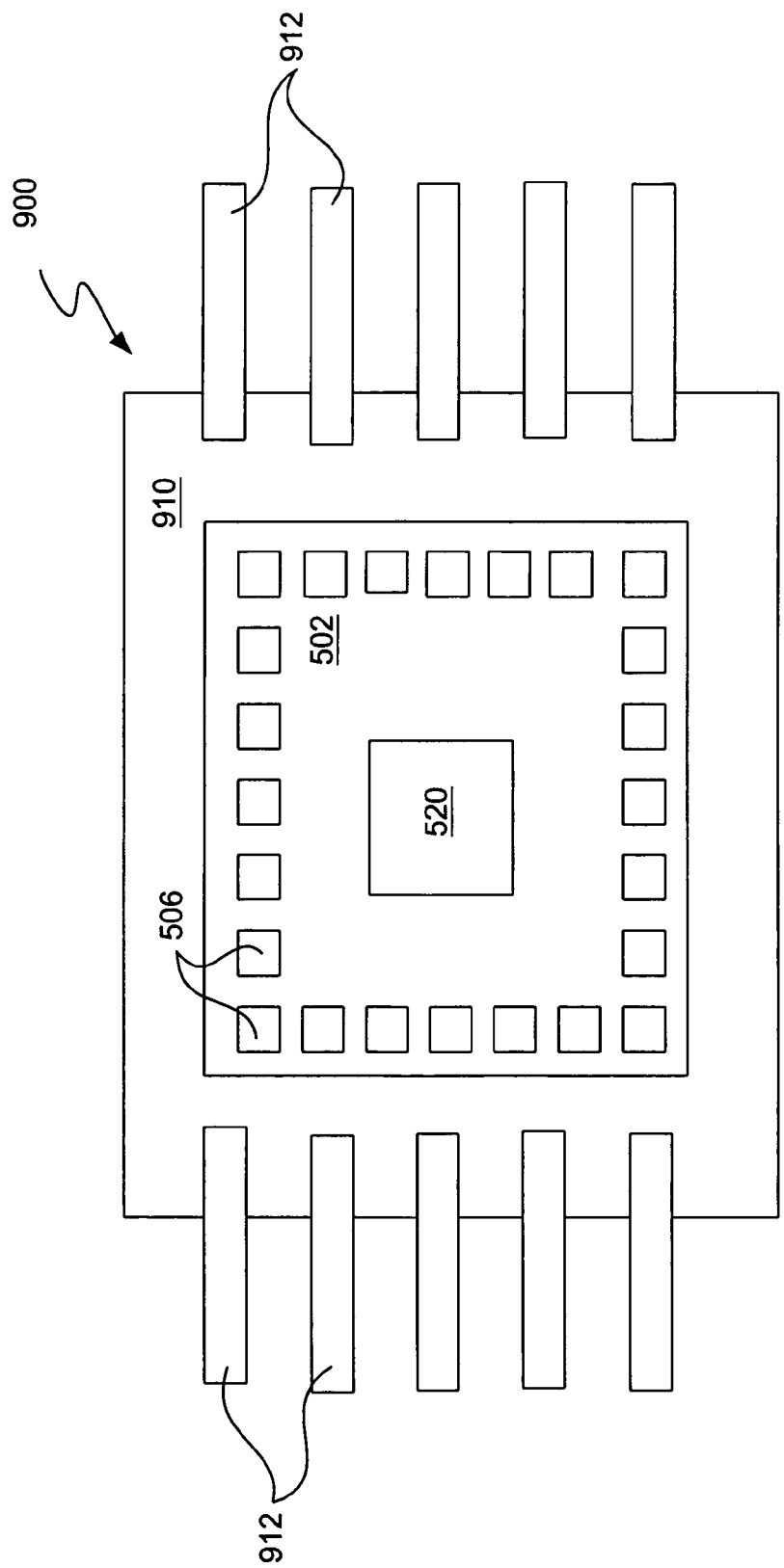
FIG. 9 is a diagram illustrating a top view of a semiconductor package design having a plurality of contacts formed in a DIP configuration in accordance with one embodiment of the present invention.

FIG. 9 is a diagram illustrating a top view of a semiconductor package design 900 having a plurality of contacts formed in a DIP configuration in accordance with one embodiment of the present invention. Preferably the semiconductor package is surface mounted to a printed circuit aboard (PCB) or other substrate by well known surface mounting techniques. Although many of the diagrams and descriptions contained in this specification refer to the exterior LLP's contact pads arranged on all four sides of the semiconductor package, such as in a quad flat pack arrangement (QFP), these descriptions are provided for illustration purposes and are not intended to limit the invention. The plurality of contacts used for surface mounting the package may be arranged in any configuration adapted to the landing pads on the PCB or other substrate. Thus, as illustrated in FIG. 9, the contacts of the exterior leadframe package 910 may be arranged, for example, in a DIP (dual in line package) configuration and still be in keeping with the spirit and scope of the present invention. The contacts 912 need not be exposed on the bottom surface of the semiconductor package 900 but may be exposed on the side or top of the package, i.e., wherever suitable for the contacts configured on the substrate to which the package is to be mounted. Thus, the internal LLP 502 may alternatively be combined with conventional leadframes to form a semiconductor package. That is, as shown in FIG. 5, the contacts 524 may form a leadless leadframe package surrounding the internal package 502 and alternatively, as shown in FIG. 9, the contacts 912 may be part of a conventional leadframe surrounding the internal package 502 such as used, for example, in dual-in-line (DIP) and quad flat pack (QFP) packages.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor package comprising:
    a die having top and bottom surfaces, the die including a plurality of bonding pads on the top surface of the die;
    a first leadframe having a first plurality of contacts, at least some of the first plurality of contacts have a first surface substantially formed in one plane to form a first mounting plane for mounting of electrical components thereon;
    conductive wires electrically connecting the first plurality of contacts to the plurality of bonding pads on the top surface of the die;
    a first encapsulant material formed over the top die surface, the conductive wires, and at least a portion of the first plurality of contacts thereby encapsulating the bonding wires while leaving the first surface of the first plurality of contacts exposed, to thereby form an internal package;
    at least one electrical component mounted on the first mounting plane, the electrical component being electrically connected to at least some of the first plurality of contacts;
    a second leadframe having a second plurality of contacts, the electrical component being electrically connected to at least some of the second plurality of contacts; and
    a second encapsulant material that encapsulates at least portions of the electrical component, the second leadframe and the internal package.

2. A semiconductor package as recited in claim 1 wherein the at least one component comprises a die.

3. A semiconductor package as recited in claim 1 wherein the first plurality of contacts are arranged in at least 2 rows on each side of the die.

4. A semiconductor package as recited in claim 1 wherein the at least one component comprises at least one of a capacitor and a resistor.

5. A method of packaging semiconductor devices comprising:
    forming an internal leadless leadframe package having a first surface and a second surface with a first plurality of contacts exposed on the first surface, the first surface configured for mounting at least one electrical component;
    providing a lead frame panel patterned to define at least one two dimensional array of device areas, each device area including a second plurality of conductive contacts, each conductive contact including a top surface suitable for wire bonding;
    adhering an adhesive tape first to the second surface of the internal leadless leadframe package;
    mounting at least one die on the first surface of the internal leadless leadframe package using a conductive epoxy; and
    electrically connecting each of the at least one die to at least one of the first and second pluralities of contacts via bonding wires.

6. A method of packaging semiconductor devices as recited in claim 5 further comprising mounting at least one of a resistor and a capacitor on the first surface.

7. A semiconductor package comprising:
    an internal package having a first plurality of contacts exposed on a first surface of the internal package, the internal package including a first die electrically connected to at least some of the first plurality of contacts and a first molding material that encapsulates at least a portion of the first die;
    a leadframe that is not part of the internal package, the leadframe having a second plurality of contacts;
    an electrical component mounted on the first surface of the internal package, the electrical component being electrically connected to at least some of the second plurality of contacts; and
    a second molding material that encapsulates at least portions of the second die, the leadframe and the internal package.

8. A semiconductor package as recited in claim 7 wherein a plurality of electrical components are mounted on the internal package.

9. A semiconductor package as recited in claim 8 wherein the plurality of electrical components include at least some passive electrical components.

10. A semiconductor package as recited in claim 9 wherein the plurality of electrical components include at least one of a capacitor and a resister.

11. A semiconductor package as recited in claim 7 wherein the electrical component is a second die.

12. A semiconductor package as recited in claim 7 wherein the electrical component is also electrically connected to at least some of the first plurality of contacts.

* * * * *